(12) United States Patent
Higashi et al.

(10) Patent No.: US 6,215,344 B1
(45) Date of Patent: Apr. 10, 2001

(54) DATA TRANSMISSION CIRCUIT

(75) Inventors: Tatsuya Higashi, Yokohama; Kazutaka Nogami, Ichikawa, both of (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/233,051

(22) Filed: Jan. 19, 1999

(30) Foreign Application Priority Data

Jan. 19, 1998 (JP) .................................................. 10-007993

(51) Int. Cl.[7] ...................................................... H03K 3/12
(52) U.S. Cl. ........................ 327/199; 327/201; 327/203; 327/208
(58) Field of Search ..................................... 327/202, 199, 327/200, 201, 203, 208, 210, 211, 212, 213, 214, 216, 219

(56) References Cited

U.S. PATENT DOCUMENTS

| | | | | |
|---|---|---|---|---|
| 4,820,939 | * | 4/1989 | Sowell et al. ........................ | 327/203 |
| 4,894,803 | * | 1/1990 | Aizaki ................................. | 365/203 |
| 5,729,172 | * | 3/1998 | Tsukada .............................. | 327/536 |
| 5,812,002 | * | 9/1998 | Yoshida .............................. | 327/210 |
| 5,831,463 | * | 11/1998 | Sachdev ............................. | 327/202 |
| 5,905,393 | * | 5/1999 | Rinderknecht et al. ............. | 327/202 |
| 5,912,937 | * | 6/1999 | Goetting et al. .................... | 377/67 |

* cited by examiner

Primary Examiner—Timothy P. Callahan
Assistant Examiner—An T. Luu
(74) Attorney, Agent, or Firm—Oblon, Spivak, McClelland, Maier & Neustadt, P.C.

(57) ABSTRACT

A data transmission circuit has a push-pull circuit including first and second MOS transistors, sequentially connected in series between a first power source potential node and a second potential node, to which a first data signal and a second data signal defined as an inverted signal of the first data signal are respectively supplied, an output capacitance connected between the second power source potential node and a connecting node between the MOS transistor and the second MOS transistor which serves as an output node of the push-pull circuit, a transfer gate connected to the output node of the push-pull circuit, a first inverter connected to the output node of the transfer gate, and a second inverter connected to the first inverter to form a feedback loop, whereby the data are transmitted by a low quantity of consumed electric power.

5 Claims, 4 Drawing Sheets

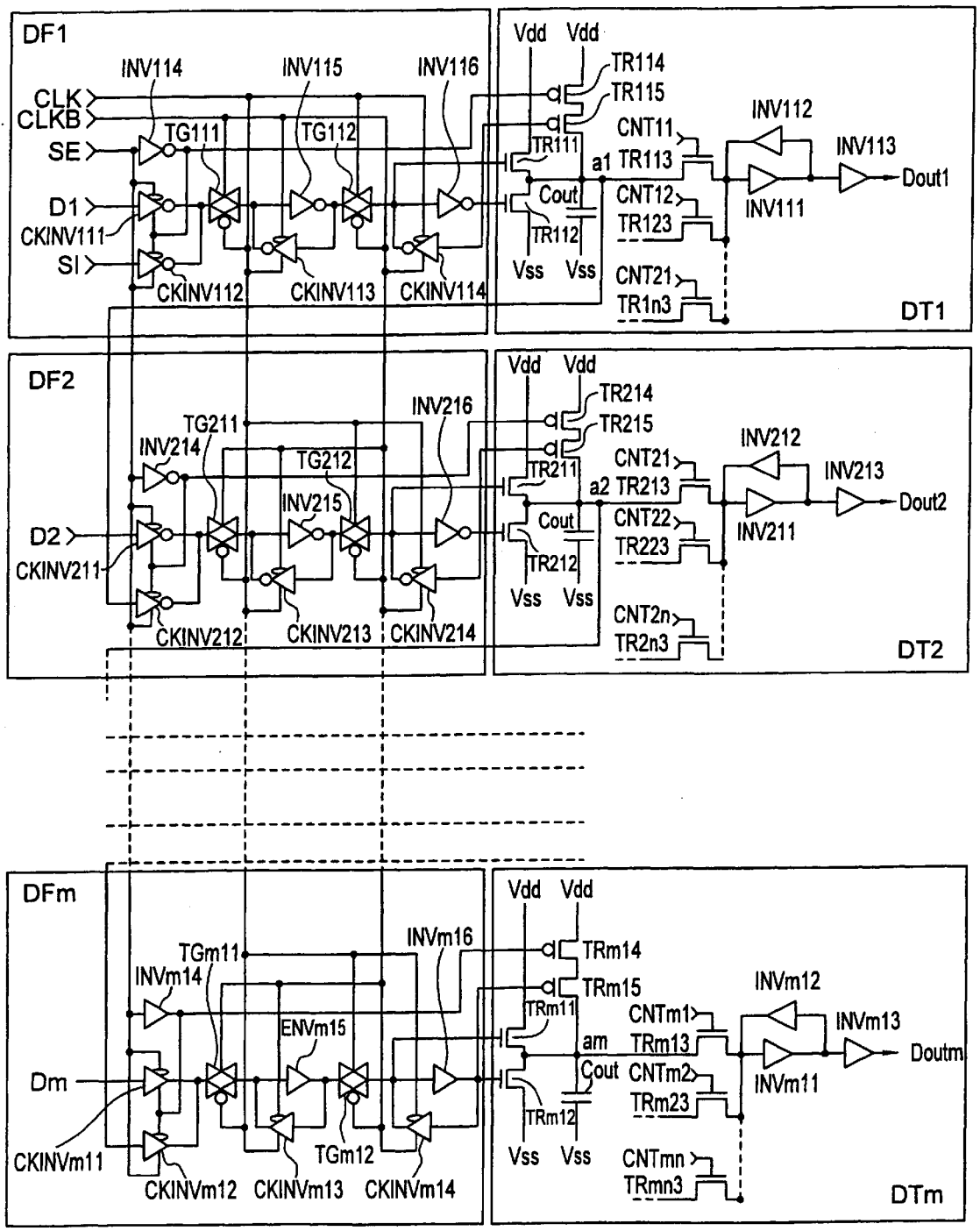
F I G. 5

DATA TRANSMISSION CIRCUIT

BACKGROUND OF THE INVENTION

The present invention relates generally to a data transmission circuit for connecting an output circuit for outputting data to an input circuit to which input data is supplied, and more particularly to a data transmission circuit used in a semiconductor integrated circuit of a data path and a memory, etc.

FIG. 7 is a circuit diagram showing a conventional data transmission circuit.

The data transmission circuit illustrated in FIG. 7 is constructed of an inverter INV and a clocked inverter CKINV that are serially connected between an output circuit 1 for outputting data and an input circuit 2 for receiving data, and an output capacitance Cout connected between an output node a of the inverter INV and a potential node Vss.

Control signals CNT and /CNT (the symbol "/" prefixed to the signal name hereinafter implies a logical inversion) are supplied to the clocked inverter CKINV, whereby the data transmission circuit is switched ON/OFF according to the necessity. The data is thus transmitted between the output circuit 1 and the input circuit 2.

In the conventional data transmission circuit shown in FIG. 7, however, a voltage applied to the node a oscillates at a full amplitude with the data output from the inverter INV, and the electric power consumed in the data transmission circuit is proportional to a square of a voltage amplitude. Accordingly, if an activation rate of the data outputted from the output circuit 1 is high, the problem is that a charging/discharging process at the output capacitance Cout is repeated, which leads to a consumption of large electric power.

Furthermore, the control signal CNT becomes "0", and accordingly the data transmission circuit is switched OFF, at which time an electric potential of an output node b of the clocked inverter CKINV, i.e., the electric potential of an input node b of the input circuit 2 comes to an electric potential between a "1" level signal potential and a "0" level signal potential of the data signal with the result that the node b is brought into a floating state. As a result, a through-current flows between a first power source potential node Vdd and a potential node Vss of an input gate circuit within the input circuit 2, and, because of a multiplicity of data transmission circuits being used in the semiconductor integrated circuit of the data path and the memory etc, this causes an increase in the consumption of the electric power.

SUMMARY OF THE INVENTION

It is a primary object of the present invention to provide a data transmission circuit requiring a low quantity of consumed electric power.

According to the present invention, there is provided a data transmission circuit comprising:

a push-pull circuit including first and second MOS transistors, connected in series between a first first power source potential node and a second power source potential node, to which a first data signal and a second data signal defined as an inverted signal of the first data signal are respectively supplied;

an output capacitance connected between the second power source node and a connecting node between said first MOS transistor and said second MOS transistor which serves as an output node of said push-pull circuit;

a transfer gate connected to the output node of said push-pull circuit;

a first inverter connected to the output node of said transfer gate; and a second inverter connected to said first inverter to form a feedback loop.

In a case where scan flip-flops and data transmission circuits are provided at a plurality of stages, when an output data signal of a push-pull circuit at each stage is changed into a scan input data signal of the scan flip-flop at the next stage, it is possible to reduce the consumed electric power by decreasing an amplitude of an output node potential of the push-pull circuit on the occasion of a storage operation and a delay operation of the scan flip-flop in a normal mode. In a scan mode, the output node potential of the push-pull circuit takes a full amplitude, the scan operation can be thereby performed while preventing a through-current from flowing due to a floating state of the node to which a scan input data signal is inputted.

BRIEF DESCRIPTION OF THE DRAWINGS

FIG. 5 is a circuit diagram showing a part of a data path circuit constructed by use of the data transmission circuit in the forth embodiment of the present invention;

DESCRIPTION OF THE PREFERRED EMBODIMENTS

Embodiments of a data transmission circuit according to the present invention will hereinafter be described with reference to the accompanying drawings.

Figure 1:
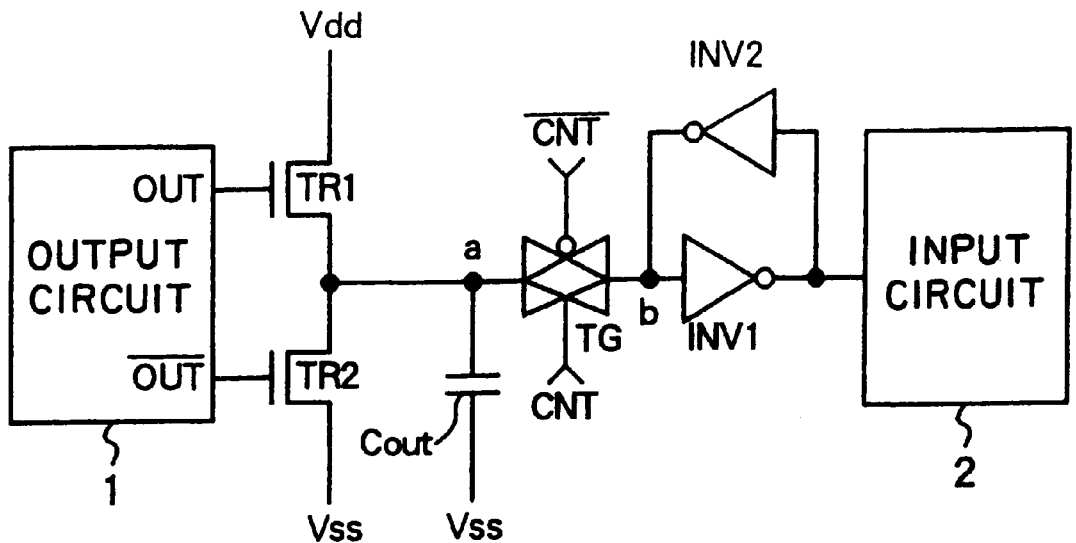
FIG. 1 is a circuit diagram showing a data transmission circuit in a first embodiment of the present invention.

FIG. 1 is a circuit diagram showing the data transmission circuit in a first embodiment of the present invention.

The data transmission circuit in the first embodiment of the present invention is constructed of a push-pull circuit, composed of N-channel type MOS transistors TR1, TR2 sequentially connected in series between a first power source potential node Vdd and a potential node Vss, to which output data signals OUT, /OUT are inputted from an output circuit 1, an output capacitance Cout connected between the potential node Vss and an output node a of the push-pull circuit, a CMOS transfer gate TG connected to the output node a of the push-pull circuit, a CMOS inverter INV1 connected to the output node b of the CMOS transfer gate TG, and a CMOS inverter INV2 connected to the CMOS inverter INV1 to form a feedback loop, wherein an output data signal from the CMOS inverter INV1 is supplied to an input circuit 2. Control signals CNT, /CNT are supplied to the CMOS transfer gate TG, thereby controlling ON/OFF states of the data transmission circuit.

The following is an explanation of an operational principle on which the data transmission circuit in the first embodiment of the present invention makes an attempt to reduce a consumption of the electric power.

When output data signals OUT, /OUT from the output circuit 1 are respectively "0" and "1", the N-channel type MOS transistor TR2 is brought into a conductive state, the output capacitance Cout is discharged, and an electric potential of the node a becomes "0". The control signals CNT, /CNT respectively become "1", "0", and the transfer gate TG is switched ON, at which time an electric potential of the node b becomes "0" and the data signal "0" exhibiting the potential of "0" turns out to be the data signal "1" upon passing through the inverter INV1 and is supplied to the input circuit 2.

On the other hand, when the output data signals OUT, /OUT from the output circuit 1 are "1", "0", the N-channel type MOS transistor TR1 is brought into the conductive state, the output capacitance Cout is charged with the electricity. Let Vthn be the threshold voltage of the N-channel type MOS transistor TR1, and the potential of the node a comes to a level given by (Vdd−Vthn). When the control signals CNT, /CNT become "1", "0" and the transfer gate TG is turned ON, the potential of the node b become at first the level given by (Vdd−Vthn) and is, when the control signals CNT, /CNT thereafter become "0", "1" and the data signal "1" exhibiting the potential (Vdd−Vthn) passes through the inverter INV1 and the feeding-back inverter INV2, thereby increased to Vdd. Then, the data signal "1" of the potential Vdd turns out to be the data signal "0" upon passing through the inverter INV1, and is supplied to the input circuit 2.

The following is a more tangible description of the operation in the latter case, i.e., when the output data signals OUT, /OUT are "1", "0". It is herein assumed that the power source potential Vdd be 3.3 V, and that the threshold voltage of the N-channel type MOS transistor TR1 be 0.6V. Upon inputting the output data signals OUT, /OUT="1", "0", the N-channel type MOS transistor TR1 becomes conductive, and the output capacitance Cout is charged with the electricity. Then, the potential of the node a is given by (Vdd−Vthn)=3.3V−0.6V=2.7V. When the transfer gate TG comes into the conductive state upon the control signals CNT, /CNT becoming "1", "0", the potential of the node b becomes at first (Vdd−Vthn)=2.7V, and this potential is supplied to the CMOS inverter INV1. Thereafter, the control signals CNT, /CNT become "0", "1", and the transfer gate TG is turned off.

Incidentally, if the voltage value of the input signal to the CMOS inverter INV1 is approximate to Vdd/2, the CMOS inverter INV1 is brought into a floating state, and it follows that a through-current flows between the potential node Vss and the first power source potential node Vdd within the CMOS inverter INV1. On the other hand, when the voltage value of the input signal to the CMOS inverter INV1 is sufficiently larger than Vdd/2 even if smaller than Vdd, the CMOS inverter INV1 operates substantially the same as in the case of inputting the data signal "1" with respect to the input signal of the potential (Vdd−Vthn).

Strictly speaking, however, the operation thereof is slightly different from the case in which the perfect data signal "1" exhibiting the potential Vdd is supplied. When the input signal having the potential (Vdd−Vthn)=2.7V is supplied to the CMOS inverter INV1, the N-channel type MOS transistor constituting the CMOS inverter INV1 is brought into an approximately perfect conductive state. A P-channel type MOS transistor constituting the CMOS inverter INV1 is not brought into a perfect non-conductive state but brought into a so-called semiconductive state. In consequence of this, the data signal outputted from the CMOS inverter INV1 is not a perfect data signal "0! Exhibiting the potential "0", and the data signal "0" exhibiting, a potential of, e.g., 0.3V is outputted. Note that after the input signal of the potential (Vdd−Vthn)=2.7V has been supplied to the CMOS inverter INV1, the transfer gate TG is turned OFF upon the control signals CNT, /CNT becoming "0", "1".

Next, when the data signal "0" of the potential 0.3V is supplied to the feeding-back CMOS inverter 2, the N-channel type MOS transistor constituting the CMOS inverter INV2 is brought into the approximately perfect non-conductive state, and the P-channel type MOS transistor constituting the CMOS inverter INV2 is brought into the approximately perfect conductive state. Hence, the data signals outputted from the CMOS inverter INV2 becomes the data signal "1", of which the power source potential Vdd is 3.3V. Namely, the data signal "1" of the potential Vdd−Vthn=2.7V passes through the inverter INV1 and the feeding-back inverter INV2, whereby the potential Vdd of the node b is increased up to 3.3V. The perfect data signal "1" showing the potential Vdd=3.3V passes through the inverter INV1 and consequently turns out to be the perfect data signal "0" exhibiting the potential "0". Then, this data signal "0" is supplied to the input circuit 2.

Accordingly, by connecting the inverter INV2 to the inverter INV1 so as to form a feedback loop, thereby making it feasible to prevent the through-current from flowing between the potential node Vss and the first power source potential node Vdd within the CMOS inverter INV1 due to the floating state of the node b. When the input signal having the potential (Vdd−Vthn) is supplied to the CMOS inverter INV1, however, the CMOS inverter INV1, as described above, needs to use the N-channel type MOS transistor TR1 having the threshold voltage Vthn, which operates substantially the same as in the case of inputting the data signal "1".

As discussed above, in the operation of the data transmission circuit in the first embodiment of the present invention, the amplitude of the potential of the node a to which connected to the output capacitance Cout is small ranging from the potential "0" to the potential (Vdd−Vthn). A consumed electric power P is expressed such as:

$$P = f \times C \times Vo2$$

where f is the circuit frequency, c is the output capacity, and Vo is the amplitude of the voltage applied to the node a to which the output capacitance Cout is connected.

Therefore, in comparison with the conventional data transmission circuit, the data transmission circuit in the first embodiment of the present invention is capable of reducing the consumed electric power by a quantity given as follows:

$$\Delta P = f \times C \times \{Vdd^2 - (Vdd - Vthn)^2\}$$
$$= f \times C \times (2Vdd \cdot Vthn - Vthn^2)$$

Figure 2:
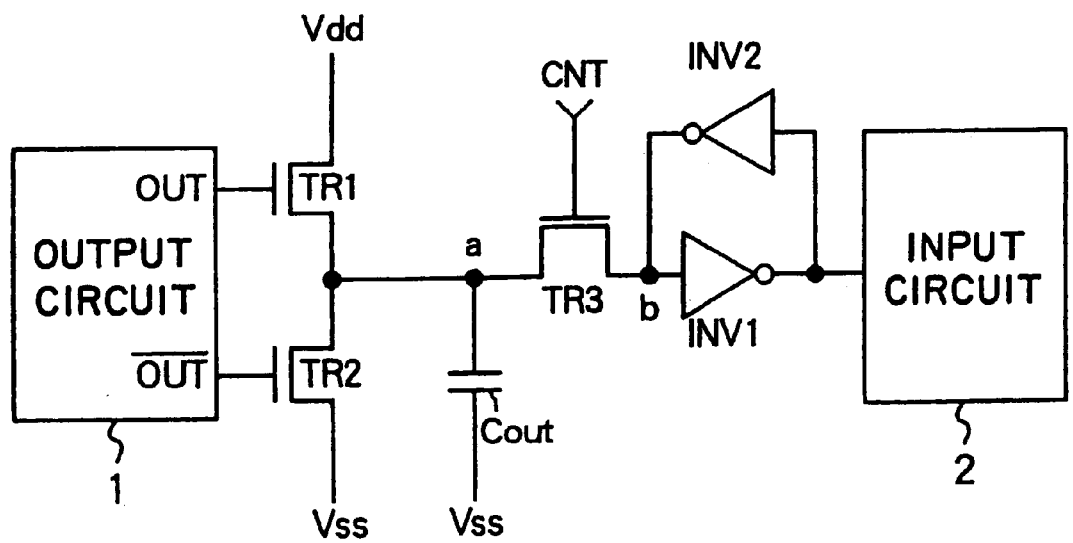
FIG. 2 is a circuit diagram showing the data transmission circuit in a second embodiment of the present invention.

FIG. 2 is a circuit diagram showing the data transmission circuit in a second embodiment of the present invention.

The data transmission circuit in the second embodiment of the present invention is constructed of a push-pull circuit, composed of the N-channel type MOS transistors TR1, TR2 sequentially connected in series between the first power source potential node Vdd and the potential node Vss, to which the output data signals OUT, /OUT are supplied from the output circuit 1, the output capacitance Cout connected between the potential node Vss and the output node a of the push-pull circuit, an N-channel type MOS transfer gate TR3 of which a drain is connected to the output node a of the push-pull circuit, the CMOS inverter INV1 connected to the output node b defined as a source of the N-channel type MOS transfer gate TR3, and the CMOS inverter INV2 which is connected to the CMOS inverter INV1 to form a feed-back loop, wherein the output data signal from the CMOS inverter INV1 is supplied to the input circuit 2. The control signal CNT is supplied to the N-channel type MOS transfer gate TR3, thereby controlling the ON/OFF states of the data transmission circuit.

Only a difference of the data transmission circuit in the second embodiment of the present invention from the data transmission circuit in the first embodiment thereof, is that the CMOS transfer gate TG in the data transmission circuit in the first embodiment is replaced with the N-channel type MOS transfer gate TR3.

The operation of the data transmission circuit in the second embodiment of the present invention is fundamentally the same as the operation of the data transmission circuit in the first embodiment thereof, however, some difference occurs when the output data signals OUT, /OUT from the output circuit 1 are "1", "0".

When the output data signals OUT, /OUT from the output circuit 1 are "1", "0", the N-channel type MOS transistor TR1 becomes the conductive state, and the output capacitance Cout is charged with the electricity. Given that Vthn is the threshold voltage of the N-channel type MOS transistor TR1, the potential of the node a is (Vdd−Vthn). When the control signal CNT is "1", the N-channel type MOS transfer gate TR3 is brought into the conductive state. Assuming that Vthn is also the threshold voltage of the N-channel type MOS transfer gate TR3, the potential of the node b becomes at first (Vdd−2Vthn), and a value of this potential is different from (Vdd−Vthn) in the first embodiment. This is derived from such an arrangement that the CMOS transfer gate TG in the data transmission circuit in the first embodiment of the present invention is replaced with the N-channel type MOS transfer gate TR3. Thereafter, the control signal CNT becomes "0", and the N-channel type MOS transfer gate TR3 comes into the non-conductive state, at which time, based on the same principle as that in the first embodiment, the data signal "1" exhibiting the potential (Vdd−2Vthn) passes through the inverter INV1 and the feeding-back inverter INV2 as well with the result that the potential of the node b rises to Vdd. Then, the data signal "1" having the potential Vdd passes through the inverter INV1, consequently turns out to be the data signal "0", and is supplied to the input circuit 2. When the input signal having the potential (VddO−2Vthn) is supplied to the CMOS inverter INV1, however, the CMOS inverter INV1, as described above, needs to use the N-channel type MOS transfer gate TR3 and the N-channel type MOS transistor TR1 having the threshold voltage Vthn, which operate substantially the same as in the case of inputting the data signal "1".

The data transmission circuit in the second embodiment of the present invention is capable of decreasing the consumed electric power as in the first embodiment, and reducing a packaging a real size with a smaller number of the transistors than in the first embodiment.

Figure 3:
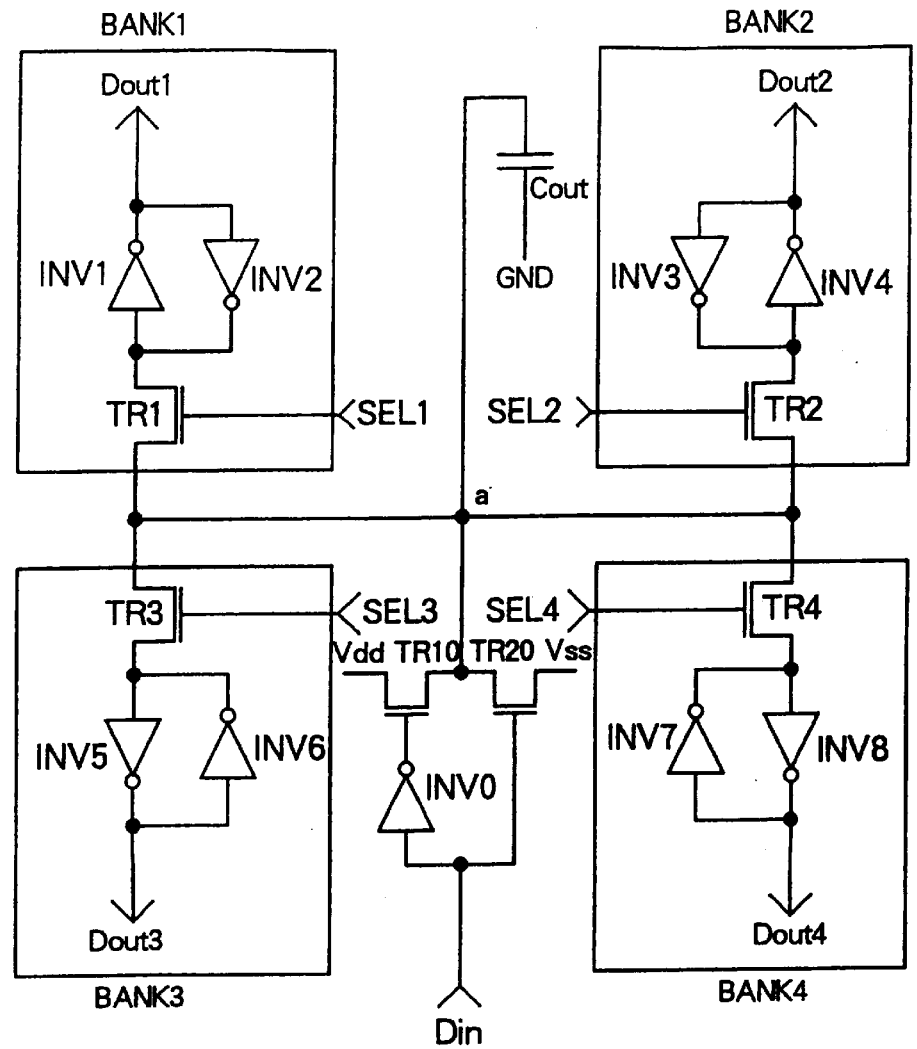
FIG. 3 is a circuit diagram showing the data transmission circuit in a third embodiment of the present invention.

FIG. 3 is a circuit diagram illustrating the data transmission circuit in a third embodiment of the present invention.

The data transmission circuit in the third embodiment of the present invention has such a construction that the data transmission circuit in the second embodiment of the present invention is applied to a memory circuit having a plurality of memory banks, a part of which is shown in FIG. 3.

The data transmission circuit in the third embodiment of the present invention is constructed of a push-pull circuit composed of two N-channel type MOS transistors TR10, TR20 sequentially connected in series between the first power source potential node Vdd and a second power source potential node Vss, wherein an input data signal Din is supplied via an inverter INV0 to a gate of the transistor TR10 and supplied directly to a gate of the transistor TR20. The data transmission circuit is also constructed of the output capacitance Cout connected between the potential node Vss and the output node a of the push-pull circuit, first through fourth N-channel type MOS transfer gates TR1, TR2, TR3 and TR4 of which drains are each connected to a drain of the output node a of the push-pull circuit, the CMOS inverter INV1 connected to a source of the N-channel type MOS transfer gate TR1, and the CMOS inverter INV2 connected to the CMOS inverter INV1 to form a feedback loop. The data transmission circuit is further constructed of a CMOS inverter INV4 connected to a source of the N-channel type MOS transfer gate TR2, a CMOS inverter INV3 connected to the CMOS inverter INV4 to form a feedback loop, a CMOS inverter INV5 connected to a source of the N-channel type MOS transfer gate TR3, a CMOS inverter INV6 connected to the CMOS inverter INV5 to form a feedback loop, a CMOS inverter INV8 connected to a source of the N-channel type MOS transfer gate TR4, and a CMOS inverter INV7 connected to the CMOS inverter INV8 to form a feedback loop. Output data signals Dout1, Dout2, Dout3 and Dout4 of the inverters INV1, INV4, INV5, INV8 are supplied respectively to first through fourth memory banks.

The N-channel type MOS transfer gate TR1 and the CMOS inverters INV1, INV2 are provided for only the first memory bank. The N-channel type MOS transfer gate TR2 and the CMOS inverters INV3, INV4 are provided for only the second memory bank. The N-channel type MOS transfer gate TR3 and the CMOS inverters INV5, INV6 are provided for only the third memory bank. The N-channel type MOS transfer gate TR4 and the CMOS inverters INV7, INV8 are provided for only the fourth memory bank. The push-pull circuit composed of the N-channel type MOS transistors TR10, TR20 and the output capacitance Cout are used in common to each of the memory banks. Selection signals SEL1, SEL2, SEL3, SEL4 are supplied respectively to the N-channel type MOS transfer gates TR1, TR2, TR3, TR4, thereby controlling the ON/OFF states of the data transmission circuit and selecting the memory bank. The operation of every component, corresponding to each memory bank, of the data transmission circuit in the third embodiment of the present invention, is the same as the operation of the data transmission circuit in the second embodiment of the present invention.

In the data transmission circuit in the third embodiment of the present invention, since the data transmission circuit in the second embodiment of the present invention is applied to the memory circuit including the plurality of memory banks, the amplitude of the potential of the node a at which to generate a potential of the data signal supplied to each memory bank is small ranging from the potential "0" to Vdd−Vthn, and the electric power consumed can be reduced. Further, the four transfer gates are provided for a couple of the push-pull circuit and the output capacitance Cout, and any one the memory banks is selected by one of the selection signals SEL1, SEL2, SEL3, SEL4. With this contrivance, only a bit line of the selected memory bank is driven, and the electric power consumed can be further decreased. Moreover, the feeding-back inverters INV2, INV3, INV6, INV7 are connected, and the bit line of the memory bank excluding the selected memory bank is thereby brought into the floating state, with the result that the through-current can be prevented from flowing to the CMOS inverters INV1, INV4, INV5, INV8.

The data transmission circuits in the first, second and third embodiments of the present invention have been described so far based on the construction that the push-pull circuit is composed of the two N-channel type MOS transistors. The push-pull circuit may be composed of twp P-channel type MOS transistors. Further, the N-channel type MOS transfer gate in each of the data transmission circuits in the second and third embodiments may be replaced with a P-channel type MOS transfer gate.

Figure 4:
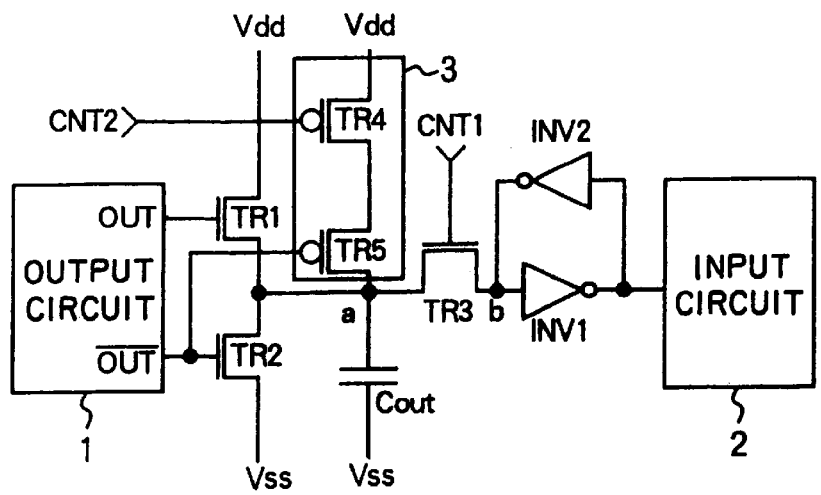
FIG. 4 is a circuit diagram showing the data transmission circuit in a fourth embodiment of the present invention.

FIG. 4 is a circuit diagram showing the data transmission circuit in a fourth embodiment of the present invention.

The data transmission circuit in the fourth embodiment of the present invention is constructed of a push-pull circuit, composed of the N-channel type MOS transistors TR1, TR2 sequentially connected in series between the first power source potential node Vdd and the potential node Vss, to which the output data signals OUT, /OUT are supplied from the output circuit 1, the output capacitance Cout connected between the potential node Vss and the output node a of the push-pull circuit, and a control circuit composed of P-channel type MOS transistors TR4, TR5 sequentially connected in series between the first power source potential node Vdd and the node a, to which the control signal CNT2 and the output data signal /OUT are respectively supplied. The data transmission circuit is also constructed of an N-channel type MOS transfer gate TR3 of which a drain is connected to the output node a of the push-pull circuit, a CMOS inverter INV1 connected to the output node b defined as a source of the N-channel type MOS transfer gate TR3, and the CMOS inverter INV2 connected to the CMOS inverter INV1 to form a feedback loop, wherein the output data signal from the CMOS inverter INV1 is supplied to the input circuit 2. The control signal CNT1 is supplied to the N-channel type MOS transfer gate TR3, thereby controlling the ON/OFF states of the data transmission circuit.

A difference of the data transmission circuit in the fourth embodiment of the present invention from the data transmission circuit in the second embodiment thereof, is that the control circuit 3 is provided between the first power source potential node Vdd and the node a.

The control signal CNT2 is "1", and the P-channel type MOS transistor TR4 of the control circuit 3 is in the non-conductive state, in which status the operation of the data transmission circuit in the fourth embodiment of the present invention in the case of the output data signals OUT, /OUT from the output circuit 1 being "0", "1", is the same as the operation of the data transmission circuit in the first or second embodiment of the present invention.

On the other hand, when the output data, signals OUT, /OUT from the output circuit 1 are "1", "0", the N-channel type MOS transistor TR1 is brought into the conductive state, and the output capacitance Cout is charged with the electricity. Then, let Vthn be the threshold voltage of the N-channel type MOS transistor TR1, the potential of the node a becomes Vdd−Vthn. Herein, when the control signal CNT2 is "1", the P-channel type MOS transistor TR4 of the control circuit 3 is in the non-conductive state, and hence the operation thereafter is the same as the operation of the data transmission circuit in the second embodiment of the present invention.

When the control signal CNT2 comes to "0" in a state where the potential of the node a becomes (Vdd−Vthn), however, both of the P-channel type MOS transistors TR4, TR5 of the control circuit 3 come into the conductive state, and hence the potential of the node a is increased to Vdd from (Vdd−Vthn). When the control signal CNT1 becomes "1", the N-channel type MOS transfer gate TR3 is also brought into the conductive state. Then, let Vthn be the threshold voltage of the N-channel type MOS transfer gate TR3, and the potential of the node b becomes at first (Vdd−Vthn). Thereafter, the control signal CNT1 becomes "0", and the N-channel type MOS transfer gate TR3 comes into the non-conductive state, at which time, based on the same principle as that in the first embodiment, the data signal "1" exhibiting the potential (Vdd−Vthn) passes through the inverter INV1 and the feeding-back inverter INV2 as well with the result that the potential of the node b rises to Vdd. Then, the data signal "1" having the potential Vdd passes through the inverter INV1, consequently turns out to be the data signal "0", and is supplied to the input circuit 2.

In a case where the output data signals OUT, /OUT from the output circuit 1 are "1", "0" and the control signal CNT2 is "1", however, when the input signal having the potential (Vdd−2Vthn) is supplied to the CMOS inverter INV1, the CMOS inverter INV1, as described above, needs to use the N-channel type MOS transfer gate TR3 and the N-channel type MOS transistor TR1 having the threshold voltage Vthn, which operate substantially the same as in the case of inputting the data signal "1".

The data transmission circuit in the fourth embodiment of the present invention, which has been discussed so far, can be used by properly switching over, if the output circuit 1 is classified as a storage circuit of a flip-flop etc, an operation of the scan flip-flop and an operation by the low consumed electric power under the control of the control circuit 3. Namely, the same effect as that in the second embodiment can be obtained when operated by the low consumed electric power. Further, the data transmission circuit in the fourth embodiment can be used for constructing a data path circuit as will hereinafter be explained.

FIG. 5 is a circuit diagram illustrating a part of a data path circuit structured by using the data transmission circuit in the fourth embodiment of the present invention.

The data path circuit shown in FIG. 5 comprises m-stages of scan flip-flops DF1–DFm, and data transmission circuits DT1–DTm individually disposed on the output sides of the scan flip-flops DF1–DFm at the respective stages. The data transmission circuits DT1–DTm at the respective stages are substantially the same circuits as the data transmission circuits in the fourth embodiment of the present invention shown in FIG. 4 and each serve as an (n:1) multiplexer.

The scan flip-flop DF1 at the first stage includes a clocked inverter CKINV111 to which an input data signal D1 is supplied, a clocked inverter CKINV112 to which a scan input data signal S1 is supplied, a transfer gate TG111 t which an output data signal of the clocked inverter CKINV111 or CKINV112 is supplied, an inverter INV115 connected to an output node of the transfer gate TG111, a clocked inverter 113 feedback-connected to the inverter INV115, a transfer gate TG112 to which an output data signal of the inverter INV115 is supplied, an inverter INV116 connected to an output node of the transfer gate TG112, a clocked inverter CKINV114 feedback-connected to the inverter INV116, and an inverter INV114 used for inverting a scan enable signal SE.

The scan enable signal SE inverted by the inverter INV114 is supplied as a clock signal to the clocked inverter CKINV111, and the scan enable signal SE is supplied as an inverted clock signal thereto. The scan enable signal SE is supplied as a clock signal to the clocked inverter CKINV112, and the scan enable signal SE inverted by the inverter INV114 is supplied as an inverted clock signal thereto. A clock signal CLK is supplied as a clock signal to the clocked inverter CKINV113 and the transfer gate TG112, and a clock signal CLKB defined as an inverted signal of the clock signal CLK is supplied as a inverted clock signal thereto. The clock signal CLKB is supplied as a clock signal to the clocked inverter CKINV114 and the transfer gate TG111, and the clock signal CLK is supplied as an inverted signal thereto.

The first-stage data transmission circuit DT1 is disposed on the output side of the first-stage scan flip-flop DF1. A front stage of the data transmission circuit DT1 comprises a first data transmission circuit constructed of a push-pull circuit composed of N-channel type MOS transistors TR111, TR112, sequentially connected in series between the first power source potential node Vdd and the second power source potential node, to which the output data signals from the clocked inverter CKINV114 and the inverter INV116 are supplied, the output capacitance Cout connected between the potential node Vss and an output node a1 of the push-pull circuit, a control circuit composed of P-channel type MOS transistors TR114, TR115, sequentially connected in series between the first power source potential node Vdd and the node a1, to which the inverted signal of the scan enable signal SE and the output data signal from the inverter INV116 are respectively supplied, and an N-channel type MOS transfer gate TR113 of which a drain is connected to the output node a1 of the push-pull circuit, and second through n-th data transmission circuits each constructed the same as the first data transmission circuit and including N-channel type MOS transfer gates TR123, TR133, . . . , TR1n3.

A rear stage of the data transmission circuit DT1 comprises a CMOS inverter INV111 connected to a source of each of the N-channel type MOS transfer gates TR113, TR123, . . . , TR1n3, a CMOS inverter INV112 feedback-connected to the CMOS inverter INV111, and an inverter INV113 connected to the output node of the CMOS inverter INV111.

Control signals CNT11, CNT12, . . . , CNT1n are individually supplied to the N-channel type MOS transfer gates TR113, TR123, . . . , TR1n3, whereby the ON/OFF states of the respective data transmission circuits at the front stage are controlled, thus enabling them to function as the (n:1) multiplexers. Namely, the output data signal from any one of the N-channel type MOS transfer gates TR113, TR123, . . . , TR1n3 which is selected by one of the control signals CNT11, CNT12, . . . , CNT1n, is outputted as output data signal Dout1 through the inverters INV111, INV112, INV113.

The scan flip-flops DF2–DFm and the data transmission circuits DT2–DTm from the second stage onward have the same constructions as those of the scan flip-flops DF1 and the data transmission circuit DT1 at the first stage. From the second stage onward, however, the output data signals of the front-stage scan flip-flops, i.e., the output data signals from the push-pull circuits of the front-stage data transmission circuits, are supplied as scan input data signals.

The data path circuit shown in FIG. 5 operates as follows. When the scan enable signal SE is "0", the scan flip-flops DF2–DFm at the respective stages perform a delay operation and a storage operation in a normal mode, and an amplitude of the potential of each of the nodes a1–am of the data transmission circuits DF1–DFm at the individual stages, is decreased as explained in the fourth embodiment, whereby the consumed electric power can be reduced. On the other hand, when the scan enable signal SE is "1", the scan flip-flops DF2–DFm at the respective stages are set in a scan mode, the control circuits of the data transmission circuits DF1–DFm at the individual stages come into the conductive state, and the potential of each of the nodes a1–am takes a full amplitude. Accordingly, it follows that the scan input data signal with the full amplitude is supplied to each of the scan flip-flops DF1, DF2–DFm at the respective stages from the first and second stages onward, and the scan operation is executed while preventing the through-current from flowing to the clocked inverters CKINV112, CKINV212, . . . , CKINVm12 due to the floating state of the node to which the scan input data signal of each f the scan flip-flops DF2–DFm at the respective stages from the second stage onward.

Figure 6:
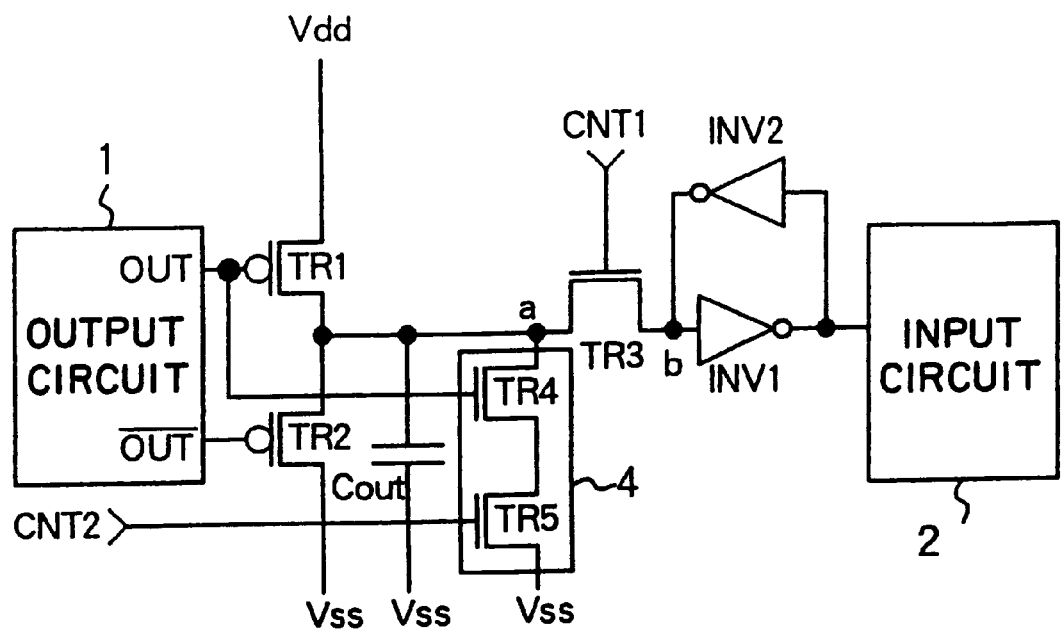
FIG. 6 is a circuit diagram showing the data transmission circuit in a fifth embodiment of the present invention.
Figure 7:
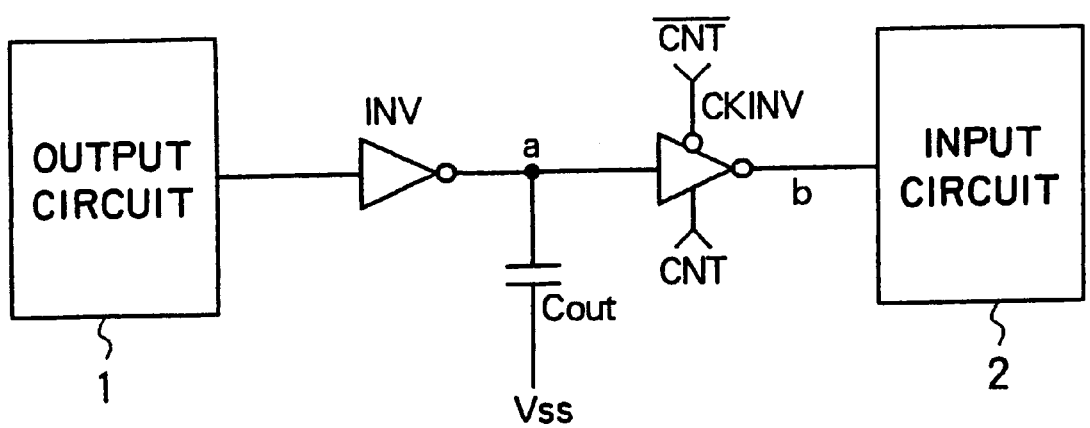
FIG. 7 is a circuit diagram showing a conventional data transmission circuit.

FIG. 6 is a circuit diagram illustrating the data transmission circuit in a fifth embodiment of the present invention.

The data transmission circuit in the fifth embodiment of the present invention is constructed of a push-pull circuit, composed of the P-channel type MOS transistors TR1, TR2 sequentially connected in series between the first power source potential node Vdd and the potential node Vss, to which the output data signals OUT, /OUT are respectively supplied from the output circuit 1, the output capacitance Cout connected between the potential node Vss and the output node a of the push-pull circuit, a control circuit 4 composed of N-channel type MOS transistors TR4, TR5 sequentially connected in series between the node a, and the potential node Vss, to which the output data signal OUT and the control signal CNT2 are respectively supplied, the N-channel type MOS transfer gate TR3 of which a drain is connected to the output node a of the push-pull circuit, the CMOS inverter INV1 connected to the output node b defined as a source of the N-channel type MOS transfer gate TR3, and the CMOS inverter INV2 feedback-connected to the CMOS inverter INV1, wherein the output data signal from the CMOS inverter INV1 is supplied to the input circuit 2. The control signal CNT1 is supplied to the N-channel type MOS transfer gate TR3, thereby controlling the ON/OFF states of the data transmission circuit.

A difference of the data transmission circuit in the fifth embodiment of the present invention from the data transmission circuit in the fourth embodiment of the present invention shown in FIG. 4, is that the N-channel type MOS transistors TR1, TR2 of the push-pull circuit in the fourth embodiment are replaced with the P-channel type MOS transistors TR1, TR2, the control circuit composed of the P-channel type MOS transistors TR4, TR5 sequentially connected in series between the first power source potential node Vdd and the node a in the fourth embodiment is replaced with the control circuit 4 composed of the N-channel type MOS transistors TR4, TR5 sequentially connected in series between the node a and the potential node Vss, and the output data signal OUT and the control signal CNT2 are supplied individually to the N-channel type MOS transistors TR4, TR5.

In a state where the control signal CNT2 is "0" and the N-channel type transistor TR5 of the control circuit 4 is in the non-conductive state, when the output data signals OUT, /OUT from the output circuit 1 are "0", "1", the P-channel type MOS transistor TR1 is brought into the conductive state, the output capacitance Cout is charged with the electricity, and the potential of the node a becomes Vdd. When the control signal CNT1 comes to "1", the N-channel type MOS transistor TR3 comes into the conductive state. Then, let Vthn be the threshold voltage of the N-channel type MOS transfer gate TR3, and the potential of the node b becomes at first Vdd–Vthn. Thereafter, the control signal CNT1 becomes "0", and the N-channel type MOS transfer gate TR3 comes into the non-conductive state, at which time, based on the same principle as that in the first embodiment, the data signal "1" exhibiting the potential (Vdd−Vthn) passes through the inverter INV1 and the feeding-back inverter INV2 as well with the result that the potential of the node b rises to Vdd. Then, the data signal "1" having the potential Vdd passes through the inverter INV1, consequently turns out to be the data signal "0", and is supplied to the input circuit 2.

On the other hand, in a case where the output data signals OUT, /OUT from the output circuit 1 are "1", "0", the transistor TR2 is brought into the conductive state, and the output capacitance Cout is discharged. Then, let Vthp be the threshold voltage of the P-channel type transistor TR2, and the potential of the node a becomes Vthp. Herein, when the control signal CNT2 is "0", the N-channel type transistor TR5 of the control circuit 4 is in the non-conductive state, and therefore the N-channel type MOS transfer gate TR3 comes into the conductive state upon the control signal CNT1 becoming "1". Then, let Vthn be the threshold voltage of the N-channel type MOS transfer gate TR3, and the potential of the node b becomes at first (Vthp−Vthn). The data signal "0" exhibiting the potential (Vthp−Vthn) passes through the inverter INV1, consequently turns out to be the data signal "1", and is supplied to the input circuit 2.

In a case where the control signal CNT2 is "1" in the state where the potential of the node a comes to Vthn, however, both of the N-channel type MOS transistors TR4, TR5 of the control circuit 4 come into the conductive state, and hence the potential of the node a is decreased to the ground potential GND from Vthp, i.e., down to "0". When the control signal CNT1 becomes "1", the N-channel type MOS transfer gate TR3 is brought into the conductive state, and the potential of the node b comes to "0". Thereafter, the control signal CNT becomes "0", and the N-channel type MOS transfer gate TR3 comes into the non-conductive state, at which time the data signal "0" exhibiting the potential "0" passes through the inverter INV1, consequently turns out to be the data signal "1", and is supplied to the input circuit 2.

In a case where the output data signals OUT, /OUT from the output circuit 1 are "0", "1" and the control signal CNT2 is "0", however, when the input signal having the potential (Vdd−Vthn) is supplied to the CMOS inverter INV1, the CMOS inverter INV1 needs to use the N-channel type MOS transfer gate TR3 having the threshold voltage Vthn, which operates substantially the same as in the case of inputting the data signal "1".

The data transmission circuit in the fifth embodiment of the present invention, which has been discussed so far, can be used by properly switching over, if the output circuit 1 is classified as the storage circuit of the flip-flop etc, the operation of the scan flip-flop and the operation by the low consumed electric power under the control of the control circuit 4. Namely, the same effect as that in the second or fourth embodiment can be obtained when operated by the low consumed electric power. Further, the data transmission circuit in the fifth embodiment can be used for constructing the above-described data path circuit illustrated in FIG. 5.

The data transmission circuit according to the present invention comprises the push-pull circuit including the first and second MOS transistors, sequentially connected in series between the first power source potential node and the second power source potential node, to which the first data signal and the second data signal defined as the inverted signal of the first data signal are respectively supplied, the output capacitance connected between the second power source potential node and the connecting node between the first and second MOS transistors which serves as the output node of the push-pull circuit, the transfer gate connected to the output node of the push-pull circuit, the first inverter connected to the output node of the transfer gate, and the second inverter connected to the first inverter to form a feedback loop. The amplitude of the potential of the output node of the push-pull circuit is decreased due to the voltage drop corresponding to the threshold voltage of the MOS transistor constituting the push-pull circuit, and the consumed electric power can be reduced. Further, the second inverter is connected to the first inverter to form a feedback loop for outputting the output data signal, and it is therefore feasible to prevent the output node of the first inverter from fallig into the floating state. Accordingly, the through-current can be prevented from flowing to the input gate circuit to which the output data signal is supplied.

What is claimed is:

1. A data transmission circuit comprising:
    a push-pull circuit including first and second MOS transistors, connected in series between a first power source potential node and a second power source potential node, to which a first data signal and a second data signal defined as an inverted signal of the first data signal are respectively supplied, said first MOS transistor and the second transistor being of the same conductivity type;
    an output capacitance connected between the second power source potential node and a connecting node between said first MOS transistor and said second MOS transistor which serves as an output node of said push-pull circuit;
    a transfer gate connected to the output node of said push-pull circuit;
    a first inverter connected to the output node of said transfer gate;
    a second inverter connected to said first inverter to form a feedback loop; and
    third and fourth MOS transistors, having a conductivity type opposite to a conductivity type of said first and second MOS transistors and sequentially connected in series between the first power source potential node and the output node of said push-pull circuit, to which a predetermined control signal and the second data signal are respectively supplied.

2. A data transmission circuit according to claim 1, wherein said data transmission circuit is connected to an output side of a scan flip-flop, changes a first output data signal of said scan flip-flop and a second output data signal defined as an inverted signal of the first output data signal into the first and second data signals, and changes a data signal generated based on a scan enable signal of said scan flip-flop into the predetermined control signal.

3. A data transmission circuit comprising:
    a push-pull circuit including first and second MOS transistors, connected in series between a first power source potential node and a second power source potential node, to which a first data signal and a second data signal defined as an inverted signal of the first data signal are respectively supplied, said first MOS transistor and the second transistor being of the same conductivity type;
    an output capacitance connected between the second power source potential node and a connecting node between said first MOS transistor and said second MOS transistor which serves as an output node of said push-pull circuit;

a transfer gate connected to the output node of said push-pull circuit;

a first inverter connected to the output node of said transfer gate;

a second inverter connected to said first inverter to form a feedback loop; and third and fourth MOS transistors, having a conductivity type opposite to a conductivity type of said first and second MOS transistors and sequentially connected in series between the output node of said push-pull circuit and the second power source potential note, to which the first data signal and a predetermined control signal are respectively supplied.

4. A data transmission circuit according to claim 3, wherein said data transmission circuit is connected to an output side of a scan flip-flop, changes a first output data signal of said scan flip-flop and a second output data signal defined as an inverted signal of the first output data signal into the first and second data signals, and changes a data signal generated based on a scan enable signal of said scan flip-flop into the predetermined control signal.

5. A data transmission circuit according to claim 4, wherein when said scan flip-flops and said data transmission circuits are provided at a plurality of stages, the output data signal of said push-pull circuit at each stage is changed into a scan input data signal of said scan flip-flop at the next stage.

* * * * *